Oct. 3, 1961 K. S. STULL, JR 3,003,115
AUTOMATIC GAIN CONTROL DELAY SYSTEM
Filed Nov. 3, 1958

WITNESSES
Leon J. Laza
James F. Young

INVENTOR
Keefer S. Stull, Jr.
BY Maury I. Hull
ATTORNEY

United States Patent Office 3,003,115

Patented Oct. 3, 1961

3,003,115

AUTOMATIC GAIN CONTROL DELAY SYSTEM

Keefer S. Stull, Jr., Baltimore, Md., assignor to Westinghouse Electric Corporation, East Pittsburgh, Pa., a corporation of Pennsylvania Filed Nov. 3, 1958, Ser. No. 771,381

6 Claims. (Cl. 330—133)

This invention relates to improvements in automatic gain control systems and apparatus, and more particularly to such systems and apparatus in which automatic gain control is not applied to input signals until the signals reach a predetermined amplitude, to thereby maintain a high signal-to-noise ratio at low signal energy levels.

Prior art automatic gain control systems are characterized by a number of disadvantages and limitations. In some prior art high gain systems, an automatic gain control voltage is developed by internal noise without presence of a signal applied to the receiver. Under these conditions, it is necessary to delay the application of the automatic gain control voltage to the input stage for weak signals in order to prevent a decrease in the signal-to-noise ratio of this system. However, if the receiving system must also handle strong signals without saturating, it is necessary that the gain of the input stage be reduced as much as that of the other stages, and a complicated circuit arrangement is required.

The system and apparatus of the instant invention provide a simple method of obtaining a desired delayed automatic gain control for weak signals, and of obtaining full automatic gain reduction on the input stage with strong signals.

In summary, the preferred embodiment of the apparatus includes a circuit in which cathode bias for the input stage is developed across a Zener diode, the characteristics of which are chosen so that the Zener diode has a Zener voltage equal to the bias desired. A second Zener diode, which is connected in the circuit in such a manner that the automatic gain control voltage must exceed its Zener voltage rating before any automatic gain control voltage is applied to the input stage, is chosen to have a Zener voltage equal to the minimum automatic gain control voltage desired which a signal must develop before an automatic gain control voltage is applied to the input tube, thereby providing what is generally known in the art as a delayed A.G.C. In addition, a clamping diode is provided to prevent voltages at a predetermined point in the circuit from assuming an undesired polarity.

Accordingly, the primary object of the invention is to provide new and improved delayed automatic gain control apparatus.

Another object is to provide new and improved automatic gain control delay apparatus employing a Zener diode or Zener diodes.

A further object is to provide a simple delayed automatic gain control system and apparatus in which delayed automatic gain control is provided for weak input signals and full automatic gain control is provided for strong input signals.

Other objects and advantages will become apparent after a study of the following specification when read in connection with the accompanying drawings, in which.

Figure 1:
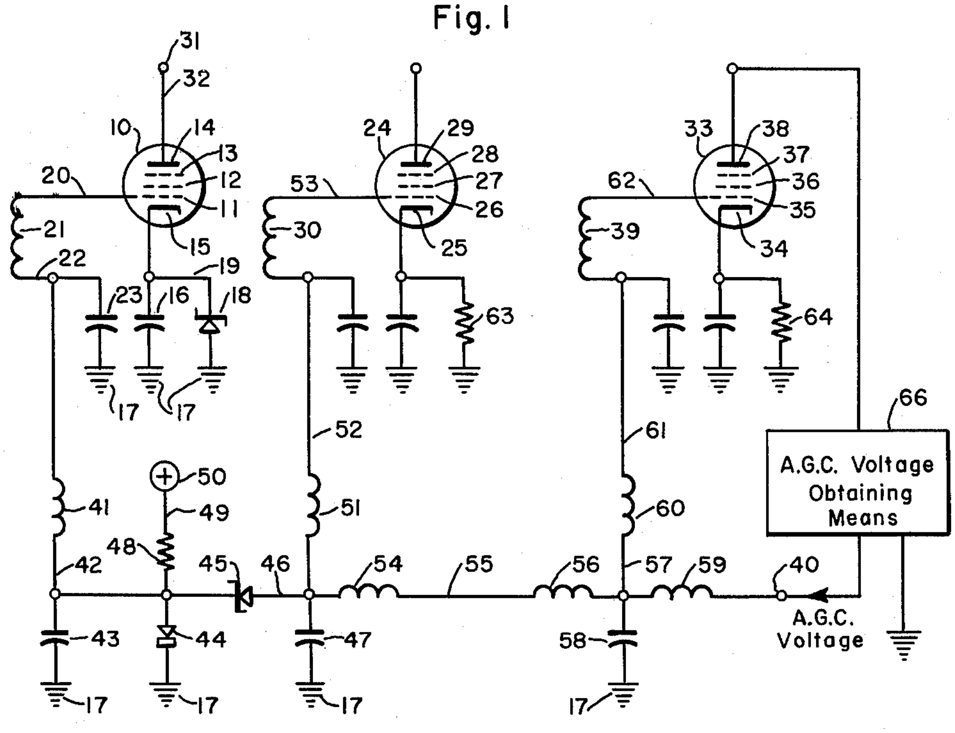
FIGURE 1 is a schematic electrical circuit diagram of the invention according to the preferred embodiment thereof.

Referring now to the drawings for a more detailed understanding of the invention, in which like reference numerals are used throughout to designate like parts, and in particular to FIG. 1, there is shown at 10 the input stage of receiving apparatus, tube 10 being in the illustration a pentode having grids 11, 12 and 13, anode 14, and cathode 15. Cathode 15 is connected by way of lead 19 and capacitor 16 to ground 17, the capacitor 16 having Zener diode 18 connected thereacross by way of lead 19. The control grid 11 of tube 10 is connected by way of lead 20 to one terminal of inductor or input transformer secondary 21 which has the other terminal thereof connected by way of lead 22 and capacitor 23 to ground 17. Any convenient signal means, not shown, may be employed for developing across coil 21 an input signal. A second stage for the receiver or gain control portion thereof is provided and includes the additional pentode tube 24 having cathode 25, grids 26, 27 and 28, and anode 29. It is not intended to limit the invention to any particular type of circuit arrangement for providing coupling between the successive stages of the receiver, and it will be understood that the output of tube 10 is applied to the input of the following stage by any convenient means, not shown, for example a transformer primary inductively coupled to coil 30, the primary, not shown, being connected in the anode-cathode circuit of tube 10, one terminal of the primary, not shown, being connected to the terminal 31 which is connected by way of lead 32 to anode 14 of tube 10 and the other terminal of the primary, not shown, being connected for example, to the positive terminal of a suitable source of anode potential, not shown, having the other negative terminal thereof connected to ground 17. This simplification of the receiving circuit is made to facilitate an understanding of the invention, since, as will be apparent from reading the specification, the important aspect of the invention is that the automatic gain control voltage is operative in the input circuits of the various tubes, and other types of input circuits are possible.

A third stage is provided including the tube 33 having cathode 34, grids 35, 36 and 37, and anode 38. Grid 35 is connected by way of lead 62 to input coil 39, which may be inductively coupled to a transformer primary energized by signals in the anode-cathode circuit of tube 24, the primary, not shown, being connected to the anode 29 of tube 24, and having in circuit therewith suitable anode energizing means.

Whereas, in the illustration of the invention only three tubes are shown having the automatic gain control voltage at terminal 40 applied thereto, it should be understood that any number of tubes could be employed in cascade and interposed in this circuit between tube 24 and tube 33.

The aforementioned lead 22 in the input stage of the first tube 10 is connected by way of a radio frequency choke coil 41, lead 42, and capacitor 43 to ground 17. Lead 42 is also connected by way of a conventional diode rectifier 44 to ground 17, and lead 42 is connected by way of Zener diode 45, lead 46, and capacitor 47 to ground 17. Lead 42 is further connected by way of resistor 48 and lead 49 to the terminal 50 of a suitable source of direct current potential, not shown, terminal 50 being of positive polarity, the source of potential, not shown, having the other negative terminal thereof connected to ground 17. The aforementioned lead 46 is connected by way of radio frequency choke coil 51 and lead 52 to one terminal of the aforementioned input winding 30 of tube 24, the other terminal of the aforementioned input inductor or winding 30 being connected by way of lead 53 to the aforemetioned control grid 26 of tube 24. Lead 46 is also connected by way of radio frequency choke 54, lead 55, radio frequency choke 56, lead 57 and capacitor 58 to ground 17. Lead 57 is further connected by way of radio frequency choke 59 to the aforementioned automatic gain control voltage input terminal 40, and lead 57 is still further connected by way of radio frequency choke 60 and lead 61 to one terminal of the aforementioned input coil 39 of tube 33, the other terminal of the input coil 39 being connected to control grid 35 by way of aforementioned lead 62.

As aforementioned, the cathode circuit of tube 10 has the Zener diode 18 connected therein, and cathode bias for tube 10 is developed across this Zener diode 18, which is chosen and selected to have a Zener voltage equal to the bias voltage desired. Bias voltages for tubes 24 and 33 are developed across resistors 63 and 64 respectively, in their cathode circuits.

The automatic gain control voltage at terminal 40 may be obtained in the receiving apparatus by any convenient means 66, not shown in detail, such as by rectifying a portion of the output of a selected stage.

In the operation of the apparatus of FIG. 1, the Zener diode 45 is chosen to have a Zener voltage equal to the automatic gain control voltage delay desired for tube 10 relative to tubes 24 and 33. The rectifier or diode 44 is used as a clamp to prevent lead 42 from going positive during the operation of the circuit. The value of resistor 48 is chosen in accordance with the potential at terminal 50 to pass the desired current, which may be of the order of 0.5 to 1 milliampere, to hold the diode 44 clamped.

Assume by way of description that there is no input signal to the receiver apparatus or winding 21 thereof and no automatic gain control voltage is developed; under these circumstances, leads 46 and 42 will both be substantially at ground potential, and all of the cathodes 15, 25 and 34 of tubes 10, 24 and 33, respectively, will be at normal bias voltages, as provided by the aforementioned Zener diode 18 and resistors 63 and 64.

Assume now by way of description that a weak signal is applied to the circuit including input coil 21 and develops a small, negative automatic gain control voltage at terminal 40. Lead 46 goes negative but lead 42 remains clamped at ground potential, since the Zener diode 45 has a very high back resistance of the order of 1 megohm for low back voltages. Accordingly, the gain of tubes 24 and 33 will decrease, but tube 10 will continue to operate at full gain as described.

Assume further by way of description that the strength of the input signal is increased; lead 46 will go more negative and lead 42 will remain at a fixed potential until the voltage at lead 46 is equal to the Zener voltage of Zener diode 45. At this time, the incremental back resistance of the Zener diode 45 becomes very low, of the order of 10 ohms, and as lead 46 goes more negative it will further change the potential on lead 42, the potential on lead 42 changing at the same rate of voltage change, but lagging behind by an amount equal to the Zener voltage of Zener diode 45. Therefore tube 10 operates at full gain only until the voltage on lead 46 reaches the Zener voltage rating of Zener diode 45, giving the desired automatic gain control delay. As lead 46 goes more negative, the gain of tube 10 will also decrease along with that of the other tubes, to thereby prevent saturation of the stage 24 by strong signals.

Figure 2:
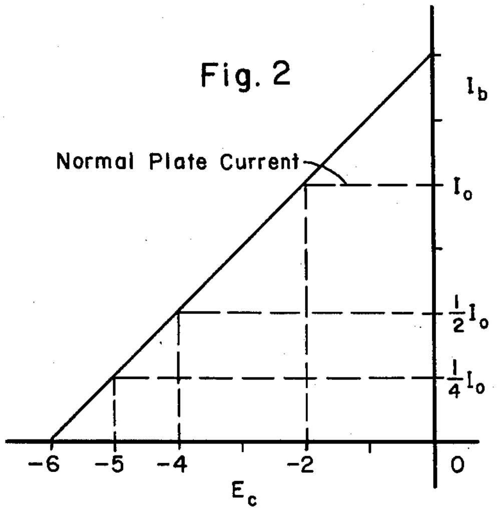
FIG. 2 is a graph illustrating the operation of the apparatus.

Particular reference should be made now to FIG. 2, which is a graph illustrating the operation of the circuits of the invention under certain assumed conditions of operation. FIG. 2 is a typical linearized transfer characteristic of the tubes used. Let it be assumed that the normal operating bias of each tube is two volts (Zener diode 18 having a Zener voltage rating of 2 volts), that the extended cutoff bias of each tube of the tubes 10, 24 and 33 is six volts, and that the Zener voltage of Zener diode 45 is three volts. When lead 46 is at —3 volts, assume that the cathode currents of tubes 24 and 33 will be cut in half; therefore, the cathode bias of each of the two tubes will drop from 2 volts to 1 volt and the net bias on tubes 24 and 33 will be three plus one, or four volts, and the gain of each of these tubes 24 and 33 will be cut in half, assuming the tube gain varies directly with cathode current. At this time the lead 42 will be at zero volts and the cathode bias of tube 10 will be two volts as maintained by Zener diode 18, and the gain of tube 10 will be normal.

Figure 3:
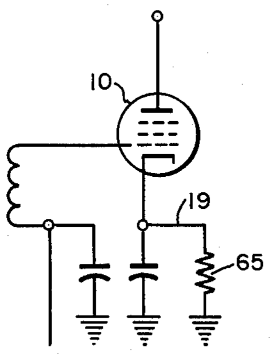
FIG. 3 is a fragmentary view of a revised portion of the circuit of FIG. 1 according to a second embodiment of the invention.

As the input signal increases, when lead 46 approaches —6 volts, tubes 24 and 33 approach cutoff, and their cathode bias and gain approach zero. At this time, lead 42 will be at minus three volts, and if tube 10 has a cathode resistor instead of Zener diode 18, as illustrated in FIG. 3, the gain of tube 10 would be only half of normal. With strong input signals, this small reduction in gain of tube 10 may not be sufficient to prevent saturation of tube 24. However, with Zener diode 18 in the cathode circuit of tube 10, the cathode bias of tube 10 remains fixed at 2 volts for all values of cathode current, so that with six volts at lead 46 and three volts at lead 42 the net bias on tube 10 is three plus two, or five volts. This reduces the cathode current and gain of tube 10 to one-fourth of normal and improves the strong signal capability of the receiver circuit.

From the above example, it can be seen that if the Zener voltage of Zener diode 45 is made equal to the normal bias voltage as established by the Zener voltage of Zener diode 18, then all of the tubes in the receiver circuit would approach cutoff simultaneously, even though tube 10 would be delayed in starting to cut off.

As is apparent from the above description, under certain conditions the Zener diode 18 may be replaced by a resistor, if desired.

If desired, automatic gain control delay may be applied to more than one stage. For example, the Zener diode 45 might be inserted in lead 55 to provide automatic gain control delay for tubes 10 and 24.

If desired, different delays may be provided for two or more stages. For example, an additional Zener diode may be added in lead 55, in which case the voltage delay for tube 24 would be the Zener voltage of the additional Zener diode, and the voltage delay for tube 10 would be the sum of the Zener voltages of Zener diode 45 and the additional Zener diode in lead 55.

Clamping diode 44 and resistor 48 may be dispensed with if desired, and replaced by a resistor connected from lead 42 to ground 17 having a value much lower than the back-resistance of Zener diode 45.

Whereas the invention has been shown and described with respect to some embodiments thereof which give satisfactory results, it should be understood that changes may be made and equivalents substituted without departing from the spirit and scope of the invention.

I claim as my invention:

1. In automatic gain control voltage delay apparatus, in combination, input circuit means adapted to have an input signal applied thereto, said input circuit means including first tube means and first biasing means for normally biasing said first tube means at a predetermined voltage in the absence of an input signal, other circuit means including other tube means, said other circuit means being operatively connected to said input circuit means whereby said other tube means has applied thereto the signal output of said first tube means, said other circuit means including other biasing means for said other tube means, voltage obtaining means operatively connected to said other circuit means for obtaining an automatic gain control voltage of uniform polarity while an input signal is applied to said input circuit means, further circuit means for applying said automatic gain control voltage to said other tube means to increase the bias thereof and decrease the gain thereof, and additional circuit means including a Zener diode connecting said further circuit means to said input circuit means whereby said automatic gain control voltage is applied to said first tube means to increase the bias thereon and decrease the gain thereof only while the amplitude of the automatic gain control voltage exceeds the Zener voltage rating of said Zener diode, no automatic gain control voltage being applied to the first tube means while the voltage output from the voltage obtaining means has an amplitude less than the Zener voltage rating of the Zener diode.

2. In automatic gain control voltage delay apparatus, in combination, input circuit means adapted to have an input signal applied thereto, said input circuit means including first tube means and first means for normally biasing said first tube means at a predetermined voltage in the absence of an input signal, said first biasing means including a first Zener diode, other circuit means including other tube means, said other circuit means being operatively connected to said input circuit means whereby said other tube means has applied thereto the signal output of said first tube means, said other circuit means including other biasing means for said other tube means, voltage obtaining means operatively connected to said other circuit means for obtaining an automatic gain control voltage of uniform polarity while an input signal is applied to said input circuit means, further circuit means for applying said automatic gain control voltage to said other tube means to increase the bias thereof and decrease the gain thereof, and additional circuit means including a second Zener diode connecting said further circuit means to said input circuit means whereby said automatic gain control voltage is applied to said first tube means to increase the bias thereon and decrease the gain thereof only while the amplitude of the automatic gain control voltage exceeds the Zener voltage rating of said second Zener diode, no automatic gain control voltage being applied to the first tube means while the voltage output from the voltage obtaining means has an amplitude less than the Zener voltage rating of the second Zener diode.

3. In automatic gain control voltage delay apparatus, in combination, input circuit means adapted to have an input signal applied thereto, said input circuit means including first tube means and a first Zener diode for normally biasing said first tube means at a predetermined voltage in the absence of an input signal, other circuit means including other tube means, said other circuit means being operatively connected to said input circuit means whereby said other tube means has applied thereto the signal output of said first tube means, said other circuit means including other biasing means for said other tube means, voltage obtaining means operatively connected to said other circuit means for obtaining an automatic gain control voltage of uniform polarity while an input signal is applied to said input circuit means, further circuit means for applying said automatic gain control voltage to said other tube means to increase the bias thereof and decrease the gain thereof, the automatic gain control voltage applied to the other tube means being substantially proportional at all times to the output of the first tube means, a second Zener diode, lead means connecting said second Zener diode to said further circuit means, additional lead means connecting said second Zener diode to said input circuit means whereby said automatic gain control voltage is applied to said first tube means to increase the bias thereon and decrease the gain thereof only while the amplitude of the automatic gain control voltage exceeds the Zener voltage rating of said second Zener diode, no automatic gain control voltage being applied to the first tube means while the voltage output from the voltage obtaining means has an amplitude less than the Zener voltage rating of the second Zener diode, the amplitude of a gain control voltage applied to the first tube means varying substantially instantaneously with variations in the amplitude of the input signal while the input signal has an amplitude sufficient to produce an output voltage from the voltage obtaining means greater than the Zener rating of the second Zener diode, and clamping means operatively connected to said additional lead means for preventing a voltage of a preselected polarity from occurring on said additional lead means.

4. In automatic gain control voltage delay apparatus, in combination, input circuit means adapted to have an input signal applied thereto, said input circuit means including first tube means and first biasing means for normally biasing said first tube means at a predetermined voltage in the absence of an input signal, other circuit means including other tube means, said other circuit means being operatively connected to said input circuit means whereby said other tube means has applied thereto the signal output of said first tube means, said other circuit means including other biasing means for said other tube means, voltage obtaining means operatively connected to said other circuit means for obtaining a rectified automatic gain control voltage of uniform polarity while an input signal is applied to said input circuit means, further circuit means for applying said automatic gain control voltage to said other tube means to increase the bias thereof and decrease the gain thereof, a Zener diode, lead means operatively connecting said Zener diode to said further circuit means, additional lead means operatively connecting said Zener diode to said input circuit means whereby said automatic gain control voltage is applied to said first tube means to increase the bias thereon and decrease the gain thereof only while the amplitude of the automatic gain control voltage exceeds the Zener voltage rating of said Zener diode, no automatic gain control voltage being applied to the first tube means while the voltage output of the voltage obtaining means has an amplitude less than the Zener voltage rating of the Zener diode, the amplitude of a gain control voltage applied to the first tube means varying substantially instantaneously with variations in the amplitude of the input signal while the input signal has an amplitude sufficient to produce an output voltage from the voltage obtaining means greater than the Zener rating of the Zener diode, and clamping means operatively connected to said additional lead means for preventing a voltage of an undesired polarity from occurring on said additional lead means.

5. In automatic gain control voltage delay apparatus, in combination, input circuit means including first tube means, other circuit means operatively connected to said input circuit means to be energized therefrom and including other tube means, voltage obtaining means operatively connected to said other circuit means for obtaining a rectified automatic gain control voltage of uniform polarity while an input signal is applied to said input circuit means, and further circuit means including Zener diode means operatively connecting said voltage obtaining means to said input circuit means and to said other circuit means, said Zener diode means having at least a portion of said automatic gain control voltage applied thereto in a reverse direction, said Zener diode means including at least one Zener diode, said further circuit means being constructed and arranged to apply at least a portion of the automatic gain control voltage to at least one of the first tube means and the other tube means to reduce the gain thereof while the amplitude of the automatic gain control voltage exceeds the Zener voltage rating of the Zener diode, no automatic gain control voltage being applied to the first tube means while the voltage at the output of the voltage obtaining means has an amplitude less than the Zener voltage rating of the Zener diode.

6. In automatic gain control voltage delay apparatus, in combination, input circuit means including first tube means and a first Zener diode operatively connected to said first tube means in the absence of an input signal for maintaining the bias on said first tube means at a value equal to the Zener voltage rating of the first Zener diode, other circuit means including other tube means and other biasing means operatively connected to said input circuit means to be energized therefrom, automatic gain control voltage obtaining means operatively connected to said other circuit means for obtaining a rectified automatic gain control voltage of uniform polarity while an input signal is applied to said input circuit means, and further circuit means including at least one additional Zener diode operatively connecting said voltage obtaining means to said input circuit means and to said other circuit means, said additional Zener diode being constructed and arranged to, while the automatic gain control voltage has a value exceeding the Zener voltage rating of the additional Zener diode, apply a portion of the automatic gain control voltage to at least one of the first tube means and other tube means to increase the bias thereon and reduce the gain thereof, no automatic gain control voltage being applied to the first tube means while the voltage at the output of the voltage obtaining means has an amplitude less than the Zener voltage rating of the additional Zener diode.

References Cited in the file of this patent

UNITED STATES PATENTS

| | | |
|---|---|---|
| 2,475,258 | Scott | July 5, 1949 |
| 2,598,237 | Donelson | May 27, 1952 |
| 2,714,702 | Shockley | Aug. 2, 1955 |
| 2,751,550 | Chase | June 19, 1956 |
| 2,757,243 | Thomas | July 31, 1956 |
| 2,799,737 | Rich | July 16, 1957 |
| 2,857,482 | Putzrath | Oct. 21, 1958 |
| 2,874,236 | Sikorra | Feb. 17, 1959 |

OTHER REFERENCES

Article I, "Reducing Standby Current with Silicon Diodes," by T. Sylvan, Electronic Design July 23, 1958, pages 36 and 37 relied upon.